(12) United States Patent
Adams et al.

(10) Patent No.: US 6,609,915 B2
(45) Date of Patent: Aug. 26, 2003

(54) INTERCONNECT FOR ELECTRICALLY CONNECTING A MULTICHIP MODULE TO A CIRCUIT SUBSTRATE AND PROCESSES FOR MAKING AND USING SAME

(75) Inventors: Christopher Scott Adams, San Jose, CA (US); Scott Brian Beardsley, Fremont, CA (US)

(73) Assignee: FCI Americas Technology, Reno, NV (US)

( * ) Notice: Subject to any disclaimer, the term of this patent is extended or adjusted under 35 U.S.C. 154(b) by 0 days.

(21) Appl. No.: 10/000,819

(22) Filed: Nov. 30, 2001

(65) Prior Publication Data

US 2003/0104713 A1 Jun. 5, 2003

(51) Int. Cl.[7] ............................................... H01R 12/00
(52) U.S. Cl. ............................................................. 439/74
(58) Field of Search ..................... 439/74, 45, 68; 257/777, 685, 686; 361/735, 743, 686, 729, 790; 174/52.1, 52.2

(56) References Cited

U.S. PATENT DOCUMENTS

| | | | | |
|---|---|---|---|---|
| 4,059,849 A | * | 11/1977 | Mitchell | ........................ 361/395 |
| 4,671,984 A | * | 6/1987 | Maeda et al. | ................ 428/209 |
| 4,956,694 A | * | 9/1990 | Eide | ............................ 357/74 |
| 6,373,714 B1 | * | 4/2002 | Kudoh et al. | ................ 361/760 |

* cited by examiner

Primary Examiner—Alexander Gilman
(74) Attorney, Agent, or Firm—Harrington & Smith, LLP

(57) ABSTRACT

An interconnect for attaching a module such as a PCB or a multi-chip module to a circuit substrate comprises a member elongated in a longitudinal direction. The member has at least a first elongated side and a second opposed and generally parallel elongated side. The first and second sides extend in the longitudinal direction. Each of the first and second sides have at least one portion formed by a series of depressions in the respective first and second sides. The depressions extend inwardly from a first outer surface of the first side and a second outer surface of the second side. The depressions are metallized to form leads. A circuit assembly is also provided comprising a multi-chip module having a plurality of electronic elements; a circuit substrate supporting thereon a conductive circuit pattern adapted for connection to the multi-chip module and at least one the interconnects for attaching the multi-chip module to the circuit pattern on the circuit substrate. A process for making the interconnect and a process for assembling the circuit assembly is also provided.

21 Claims, 5 Drawing Sheets

INTERCONNECT FOR ELECTRICALLY CONNECTING A MULTICHIP MODULE TO A CIRCUIT SUBSTRATE AND PROCESSES FOR MAKING AND USING SAME

BACKGROUND OF THE INVENTION

1. Field of the Invention

The present invention relates to an interconnect having peripheral leads. The interconnect is particularly adapted for connecting a multi-chip module or a PCB to a circuit substrate such as a PCB to form a circuit assembly. The invention also relates to processes for making and using an interconnect having peripheral leads.

2. Brief Description of Prior Developments

Numerous interconnect devices are employed in electronic packaging for electronic devices. U.S. Pat. Nos. 5,558,271, 6,034,423, 6,041,495, and 6,071,754 illustrate many of these approaches such as the use of lead and tape frames, ball grid arrays, and flip-chip interconnects.

Pin and socket type interconnects for stacking modules are described in U.S. Pat. Nos. 5,460,531 and 5,613,033.

U.S. Pat. No. 5,069,626 discloses a semiconductor device package comprising a molded polymeric substrate having castellated leads. The interconnect of this electronic package does not connect a multi-chip module or a PCB to a circuit board. It is a component package providing an integrated circuit to board connection. In contrast in accordance with this invention a multi-chip device package or PCB is connected to a circuit substrate or PCB by a separate interconnect member having leads in peripheral depressions.

U.S. Pat. No. 5,247,423 discloses stackable multi-chip modules employing a plurality of edge metal conductors that form half-vias which provide a castellated appearance. Solder plated wires are fitted within the half-vias and reflowed to the conductor traces to interconnect the semiconductor devices of the modules. In contrast in accordance with this invention a multi-chip device package or PCB is connected to a circuit substrate by a separate interconnect member having leads in peripheral depressions.

SUMMARY OF THE INVENTION

In accordance with one preferred embodiment of the invention an interconnect is provided for attaching a module such as a PCB or a multi-chip module to a circuit substrate. A member elongated in a longitudinal direction has at least a first elongated side and a second opposed and generally parallel elongated side. The first and second sides extend in a longitudinal direction. Each of the first and second sides has at least one portion formed by a series of depressions in the respective first and second sides extending inwardly from a first outer surface of the first side and a second outer surface of the second side. The depressions are metallized to form leads.

In accordance with another preferred embodiment of the invention a multi-chip module circuit assembly is provided comprising a multi-chip module, a circuit substrate and at least one interconnect. The multi-chip module includes a plurality of electronic elements. The circuit substrate supports a conductive circuit pattern adapted for connection to the multi-chip module. At least one interconnect in accordance with the previous embodiment attaches the multi-chip module to the circuit pattern on the circuit substrate. The leads of the interconnect member connect at least one of the electronic elements of the multi-chip module to the conductive circuit pattern of the circuit substrate. The circuit assembly preferably includes a plurality of the interconnect members of this invention connected between the multi-chip module and the circuit substrate.

In a particularly preferred embodiment of the circuit assembly the multi-chip module includes a first major face and a second opposed major face. First electronic elements are supported on the first face and additional second electronic elements are supported on the second face. The interconnect members space the multi-chip module from the circuit substrate by an amount greater than the thickness of electronic elements arranged on the multi-chip module between the multi-chip module and the circuit substrate. Preferably at least two of the interconnect members connect the multi-chip module to the circuit substrate.

In accordance with yet another preferred embodiment of the invention a process for making an interconnect for attaching a multi-chip module to a circuit substrate is provided. The processes comprises providing a member elongated in a longitudinal direction. A series of circuit pads are formed on opposing major faces of the member. The circuit pads are arranged in at least two lines in the longitudinal direction on each of the major faces. The circuit pads in a line on one major face of the member are aligned with respective opposing circuit pads on the other major face of the member. A series of openings are formed in the circuit pads. The openings extend through the member and at least one circuit pad on one of the major faces and at least another circuit pad on the opposing major face. The openings are arranged in the at least two lines. A conductive metalization is formed in the openings for electrically connecting each of the one circuit pads to a respective one of the another circuit pads. The member is divided along a generally central axis of the openings in the at least two lines to provide at least one interconnect member as described in the first embodiment of the invention.

In accordance with a still further preferred embodiment of the invention a process is provided for attaching a multi-chip module to a circuit substrate. The process of this embodiment comprises providing a multi-chip module, a circuit substrate and at least one interconnect member of the type described in the previous preferred embodiments. The multi-chip module has a plurality of electronic elements. The circuit substrate supports thereon a conductive circuit pattern adapted for connection to the multi-chip module. The at least one interconnect member includes metallized depressions which form leads for connecting at least one electronic element of the multi-chip module to the conductive circuit pattern of the circuit substrate. A sub-assembly is formed by attaching the at least one interconnect member to the multi-chip module to make a desired electrical connection between at least one of the leads of the interconnect member and the at least one electronic element. The sub-assembly is then attached to the circuit substrate to make at least one desired electrical connection between the at least one lead of the interconnect member and the conductive circuit pattern of the circuit substrate.

In a particularly preferred embodiment of this process embodiment the multi-chip module includes a first major face and a second opposed major face. First electronic elements are supported on the first face and additional second electronic elements are supported on the second face. The interconnect members are formed so as to space the multi-chip module from the circuit substrate by an amount greater than the thickness of electronic elements arranged on the multi-chip module between the multi-chip module and the circuit substrate. Preferably at least two of the interconnect members are connected between the multi-chip module and the circuit substrate.

BRIEF DESCRIPTION OF THE DRAWINGS

The method and connector of the present invention is further described with reference to the accompanying drawings in which.

DETAILED DESCRIPTION OF THE PREFERRED EMBODIMENTS

While the present invention will hereinafter be described in connection with preferred embodiments thereof, it will be understood that it is not intended to limit the invention to that embodiment. On the contrary, it is intended to cover all alternatives, modifications and equivalents as may be included within the spirit and scope of the invention as defined by the appended claims.

Figure 1:
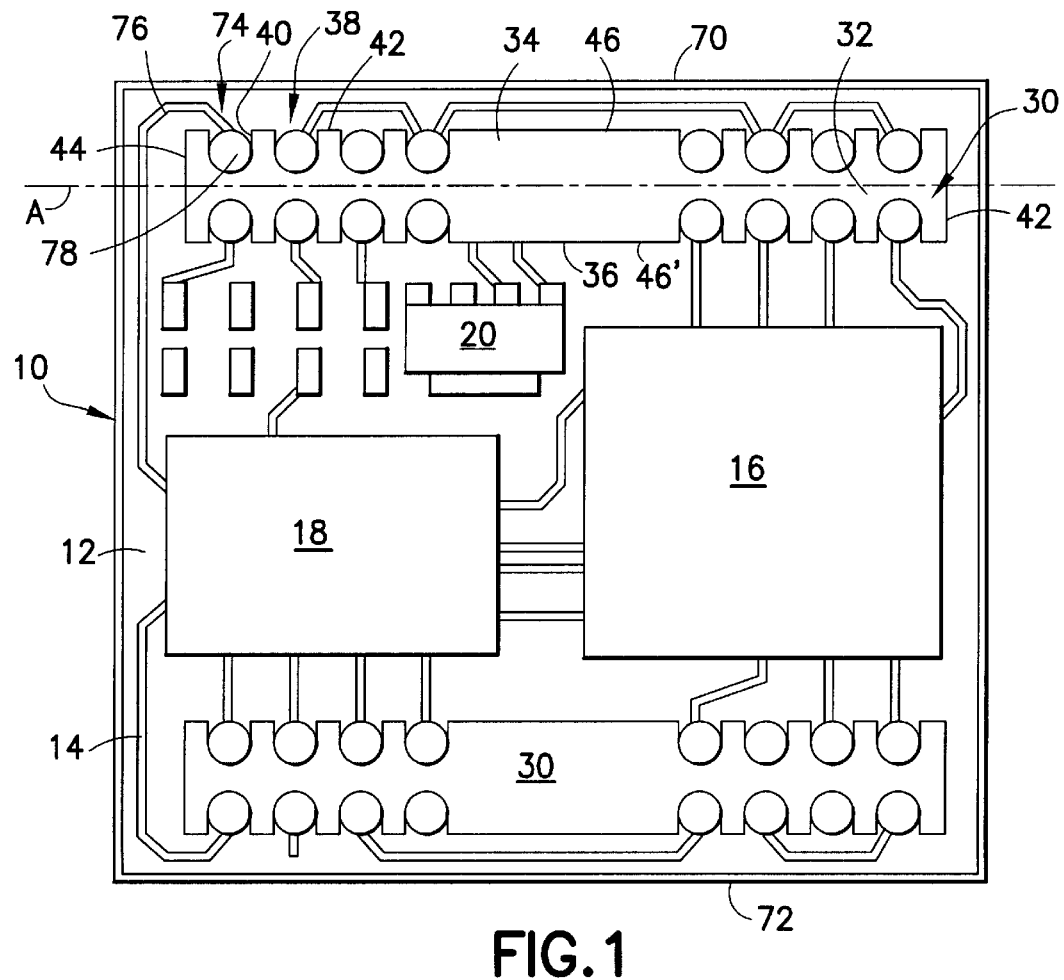
FIG. 1 is a top plan view of a multi-chip module having interconnect members placed on it in accordance with the present invention.
Figure 2:
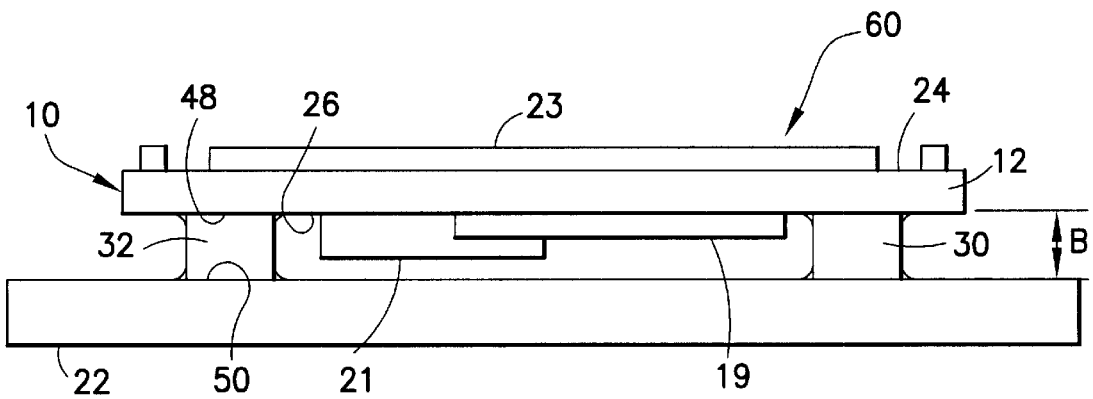
FIG. 2 is a side elevational view of a multi-chip module connected by interconnects in accordance with this invention to a circuit substrate.

Referring now to FIGS. 1 and 2 there is shown a multi-chip module 10. The module 10 can have any desired design. Generally it comprises a circuit substrate 12 which may comprise a printed circuit board. The substrate 12 may be formed of any conventional material such as ceramic or polymers or glass filled polymers such as FR4. The substrate 10 shown, for example, is a printed circuit board formed from a laminate, comprising a glass filled polymer core clad with a thin copper layer on each side of the core. If desired the substrate can be a multilayer board having additional copper layers intermediate the clad copper layers. The copper clad layers may be patterned by conventional photolithographic techniques to form a desired circuit pattern 14. A plurality of electronic devices 16, 18, 20, are mounted to the circuit substrate 12 and connected to the circuit pattern 14 or traces by conventional means such as, for example, surface mounting. The electronic devices 16, 18, 20 may be any desired device such as, for example, integrated circuits. In a general sense the substrate 12 could be a PCB for use other than as a multi-chip module.

Typically multi-chip modules 10 have electronic devices on one side and are attached to a circuit substrate, such as circuit board 22, by a conventional interconnect such as pins, ball grid array, etc. The circuit board 22 may be of any conventional design and is generally constructed of materials similar to the circuit substrate 12 and includes circuit patterns or traces 62 for interconnecting electronic devices formed in a manner similar to the circuit pattern 14.

In accordance with this invention, the multi-chip module 10 preferably includes one or more electronic devices 19, 21 on a first major face 26 and one or more electronic devices 23 on the second major face 24 of the circuit substrate 12. The electronic devices 19 and 21 on the bottom of the module 10 make the use of conventional interconnects, particularly surface mount interconnects, impractical.

In accordance with one preferred embodiment of the invention an interconnect 30 is provided for attaching a multi-chip module 10 or PCB to a circuit substrate 22 which can be a PCB. A member 32 elongated in the longitudinal direction of axis (A) has at least a first elongated side 34 and a second opposed and generally parallel elongated side 36. The first 34 and second 36 sides extend in the longitudinal direction. Each of the first and second sides 34, 36 has at least one portion 38 formed by a series of depressions 40 in the respective first and second sides 34, 36 extending inwardly from a first outer surface 42 of the first side 34 and a second outer surface 44 of the second side 36. The depressions 40 are metallized in the manner, which will be described later to form leads.

In use, the interconnect members 30 act both as leads connecting the circuitry of the module 10 to the circuitry of the substrate 22 and as standoffs which support the multi-chip module above the circuit substrate 22 to provide a gap (B) which is greater than the thickness of the electronic devices 19, 21 on the bottom of the module 10.

The depressions 40 preferably have a generally semi-cylindrical shape. Each of the first and second sides 34, 36 extends from a first transverse end 42 of the interconnect member 32 to a second transverse end 44 of the member. Each of the sides 34 and 36 further includes at least one portion 46, 46', intermediate the ends 42, 44, which is depression free. The member 32 further includes third 48 and forth 50 opposed elongated sides extending respectively between the first and second sides 34, 36. The portion of each of the third and fourth sides 48, 50 associated with the portions 46, 46' of the first and second sides 34, 36 are designed for receiving a pick and place assembly device.

Figure 11:
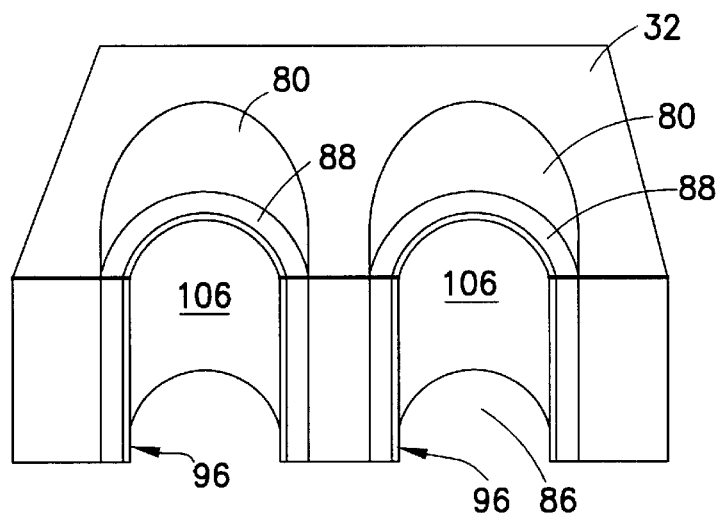
FIG. 11 is a partial perspective view of the interconnect member castellations after plating with solder.

In accordance with another preferred embodiment of the invention a multi-chip module circuit assembly 60 is provided which comprises a multi-chip module 10, a circuit substrate 22 and at least one interconnect 30. The multi-chip module 10 includes a plurality of electronic elements 16, 18–21. The circuit substrate 22 supports a conductive circuit pattern 62 (FIG. 3) adapted for connection to the multi-chip module 10. At least one interconnect 30 in accordance with the previous embodiment attaches the multi-chip module 10 to the circuit pattern 62 on the circuit substrate 22. The leads 96 (FIG. 11) of the interconnect member 10 connect at least one of the electronic elements 16, 18–21 of the multi-chip module 10 to the conductive circuit pattern 62 of the circuit substrate. The circuit assembly 60 preferably includes a plurality of the interconnect members 30, such as the two shown, connected between the multi-chip module 30 and the circuit substrate 22. If desired more than two interconnects 30 can be employed.

In a particularly preferred embodiment of the circuit assembly 60 the multi-chip module 10 includes a first major face 24 and a second opposed major face 26. First electronic elements 16, 18–20 are supported on the first face 24 and additional second electronic elements 19, 20 are supported on the second face 26. Each face 24, 26 may have any desired number of electronic devices. The interconnect members 32 space the multi-chip module 10 from the circuit substrate 22 by an amount greater than the thickness of electronic elements 19, 21 arranged on the multi-chip module 10 between the module and the circuit substrate 22. In accordanace with a preferred embodiment of the invention the interconnects are located toward an adjacent side 70, 72 of the module 10.

Figure 3:
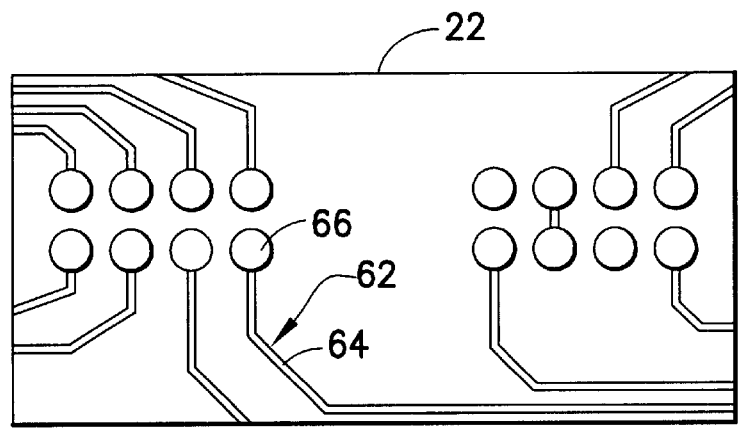
FIG. 3 is an exemplary partial top view of a circuit substrate showing one of many versions of a pattern of conductive circuit traces or conductors.

FIG. 3 shows a circuit pattern 62 on a typical circuit substrate 22 for connection to the interconnect 30 of this invention. A similar pattern 74 is present on the module 10 as shown in FIG. 1. Each of the circuit patterns 62 and 74 includes circuit traces 64, 76 which terminate at interconnect circuit pads 66, 78. The circuit pads 66, 78 may have any desired diameter and spacing as are conventional in the art. The castellations 38 of the interconnect member 32 are arranged in correspondence with the pads 66, 78 positions so that in use the pads 66, 78 lie under the respective ends of the depressions 40.

Referring now to FIGS. 1–8 in accordance with yet another preferred embodiment of the invention a process for making an interconnect 30 for attaching a multi-chip module 10 to a circuit substrate 22 is provided. The process comprises providing a member 32 elongated in the longitudinal direction. A series of circuit pads 80 are formed on opposing major faces 48, 50 of the member 32. The circuit pads 80 are arranged in at least two lines 82, 84 in the longitudinal direction on each of the major faces 48, 50. The circuit pads 80 in a line 82, 84 on one major face 48 of the member 32 are aligned with respective opposing circuit pads 80' on the other major face 50 of the member 32 in a similar manner (FIG. 9). The pads 80, 80' may have any desired shape, however, an oval shape as shown is preferred.

Figure 5:
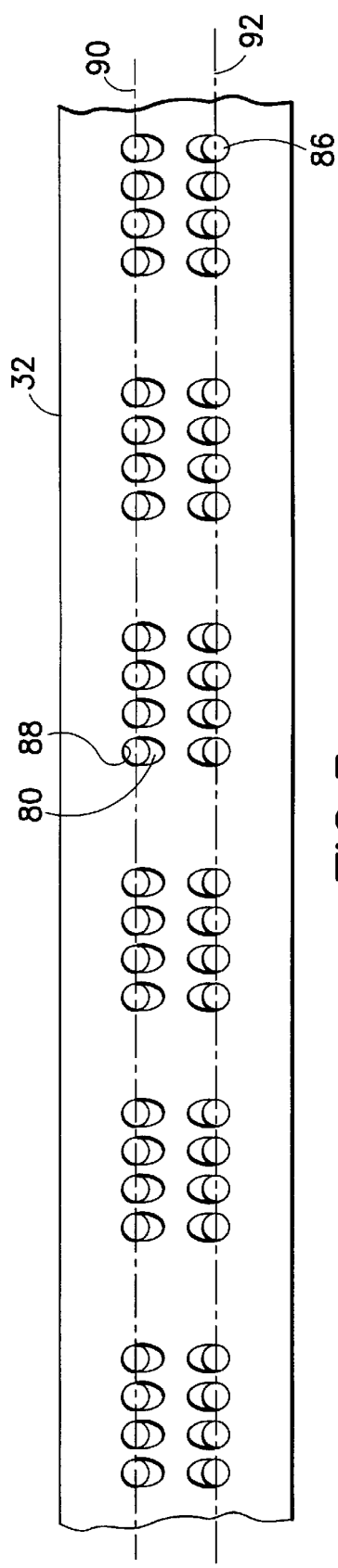
FIG. 5 is a partial top view of an interconnect member in accordance with a preferred embodiment of this invention during a further stage of its fabrication.

A series of openings 86 are formed in the member 32 and the circuit pads 80, 80'. The openings 86 extend through the member 32 and at least one circuit pad 80 on one of the major faces 48 and at least another circuit pad 80' on the opposing major face 50 as shown in FIG. 9. The openings are arranged in the at least two lines 90 and 92 (FIG. 5). A conductive metalization 88 is formed in the openings 86 for electrically connecting each of the circuit pads 80 to a respective corresponding circuit pad 80'. The member 32 is then divided along the generally central axes 90, 92 of the openings 86 in the at least two lines, to provide at least one interconnect member 32 as described in first embodiment of the invention.

In accordance with a still further preferred embodiment of the invention a process is provided for attaching a multi-chip module 10 to a circuit substrate 22. The process of this embodiment comprises providing a multi-chip module 10, a circuit substrate 22 and at least one interconnect member 32 of the type described in the previous preferred embodiments.

The multi-chip module 10 has a plurality of electronic elements 16, 18–21. The circuit substrate 22 supports thereon a conductive circuit pattern 62 adapted for connection to the multi-chip module 10. The at least one interconnect member 32 has leads 96 (FIG. 11) for electrically connecting at least one electronic element 16, 18–21 of the multi-chip module 10 to the conductive circuit pattern 62 of the circuit substrate 22. A sub-assembly 60 is formed by attaching the at least one interconnect member 32 to the multi-chip module 10 to make a desired electrical connection between at least one of the leads 96 of the interconnect member 32 and the circuit pattern 74 which is electrically connected to the at least one electronic element 16, 18–21. The partially assembled sub-assembly 60 is then attached to the circuit substrate 22 so that the at least one interconnect member 32 makes at least one desired electrical connection between the at least one lead 96 of the interconnect member and the conductive circuit pattern 74 of the circuit substrate 22.

Preferably at least two or more of the interconnect members 32 are connected between the multi-chip module 10 and the circuit substrate 22. The interconnect members may be located on the multi-chip module 10 toward the adjacent sides 70, 72 of the module 10 to provide improved structural integrity.

The invention will now be described by way of a detailed example but it is not intended to limit the invention to this specific approach and numerous other ways of carrying out the invention are possible. This particular example utilizes two intermediary PCBs (printed circuit boards) as interconnect members 32 with "plated through-holes" that are routed through and plated-up to serve as leads. However, any desired method for making the interconnect members 32 can be employed. While it is preferred to start with conventional PCB board materials using glass filled epoxy with copper foil attached to the major surfaces of the board, any other suitable substrate materials could be employed including, without limitation ceramics, glass, or metals coated with an insulator. The metal layers of the board may be foil or could be formed by plating or vapor deposition or any other desired approach. While it is preferred to divide the substrate 32 to form the interconnects 30 by routing, any desired dividing method can be used, including without limitation, other machining methods, shearing, sawing, laser cutting or ablation, etc. Further any desired number of interconnects 30 may be employed in making the multi-chip module 10 to circuit substrate 22 connection. The interconnect of this invention is generally adapted to electrically interconnect two circuit boards, by being sandwiched between them, to create a board to board or board to daughter board interconnect. It is particularly adapted to attach multi-chip modules 10 to a circuit substrate.

The interconnect member 32 of the present invention preferably can be surface mounted in an automated fashion onto standard circuit pattern 62, 74 pads 66, 78 arranged in a conventional progression. For example, 0.035 inch round pads 66, 78 can be used on a 0.050 inch progression. The pads 66, 78 may have any desired shape and are not limited to round pads.

Figure 4:
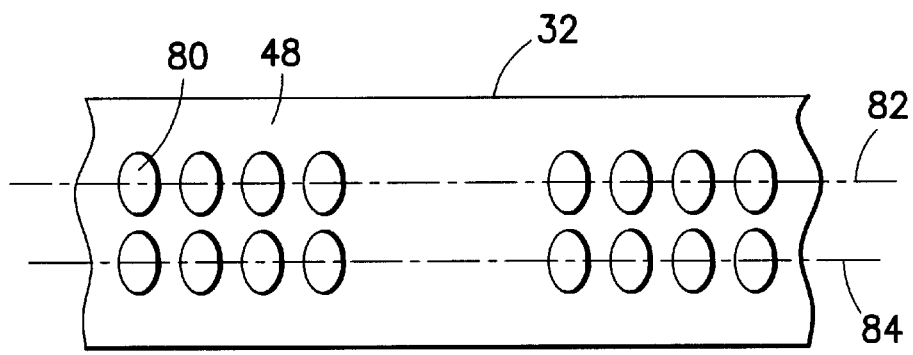
FIG. 4 is a partial top view of an interconnect member in accordance with a preferred embodiment of this invention during a first stage of its fabrication.

FIG. 3 depicts a simplified representation of a circuit layout 62, which is suitable for use both on the multi-chip module PCB 12 as pattern 74 as well as the circuit substrate PCB 22. The layout of the interconnect member PCB 32 as shown in FIG. 4 employs a relatively simple construction which begins with a double-sided I oz. copper foil clad FR-4 PCB 32, to create a series of 0.035" by 0.050" oblong pads 80 on a 0.050" by 0.065" progression along the axes 82 and 84 on the top and bottom major faces 48, 50 (see also FIG. 9) of the strip or board.

Figure 12:
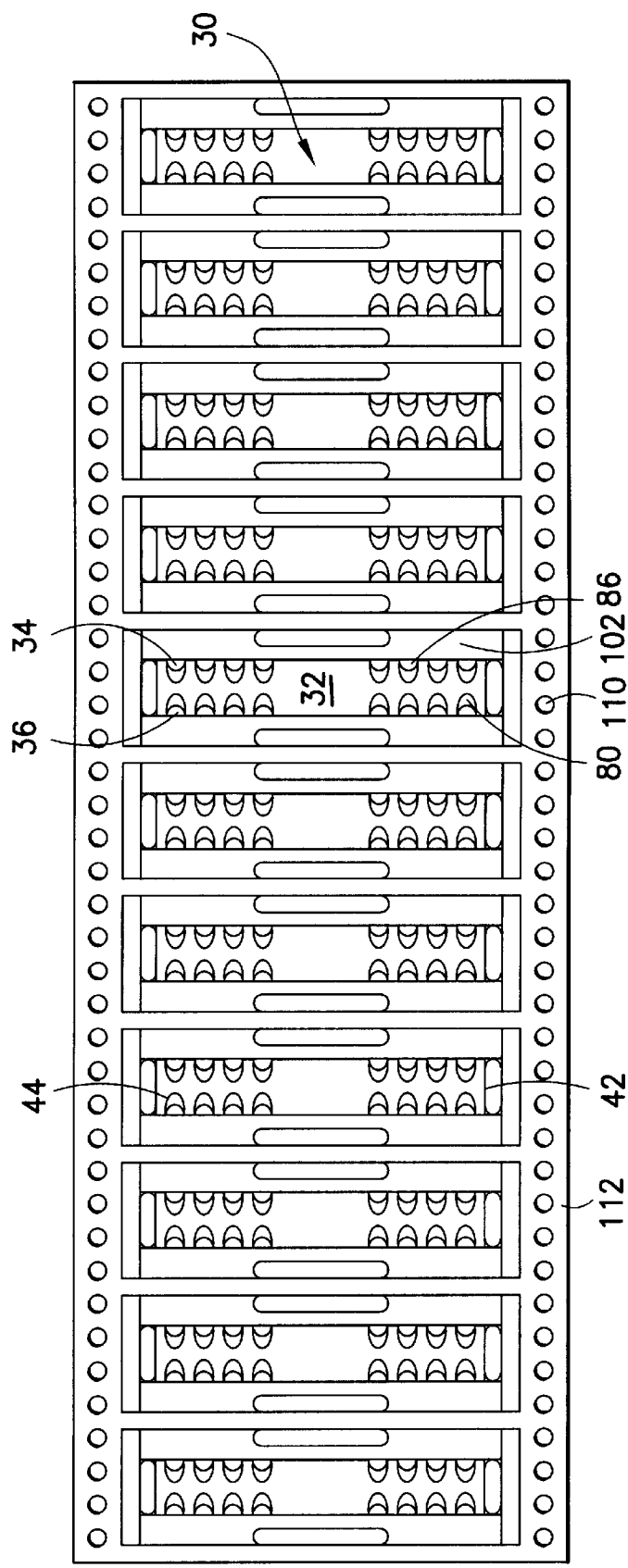
FIG. 12 is a top view of interconnect members in accordance with another preferred embodiment of the invention wherein the members are supported by a tape like carrier for reel feeding to an assembly station.

While a rigid PCB strip is shown which provides a line of interconnect members, if desired a board could be employed to form rows and columns of interconnect members, for later singulation. A strip type approach can also be used with a flexible PCB type material using Capton, for example, as the core material. This would enable the strip of interconnect members 32 to be wound up in reel form for use in reel to reel manufacturing techniques as shown in FIG. 12. In FIG. 12 the interconnects 30 are supported in the flexible PCB carrier which has sprockets 110 to allow measured advancement during assembly processing. In processing the interconnects would generally be severed from the strip carrier 112 as the interconnects are placed on the module 10.

Figure 6:
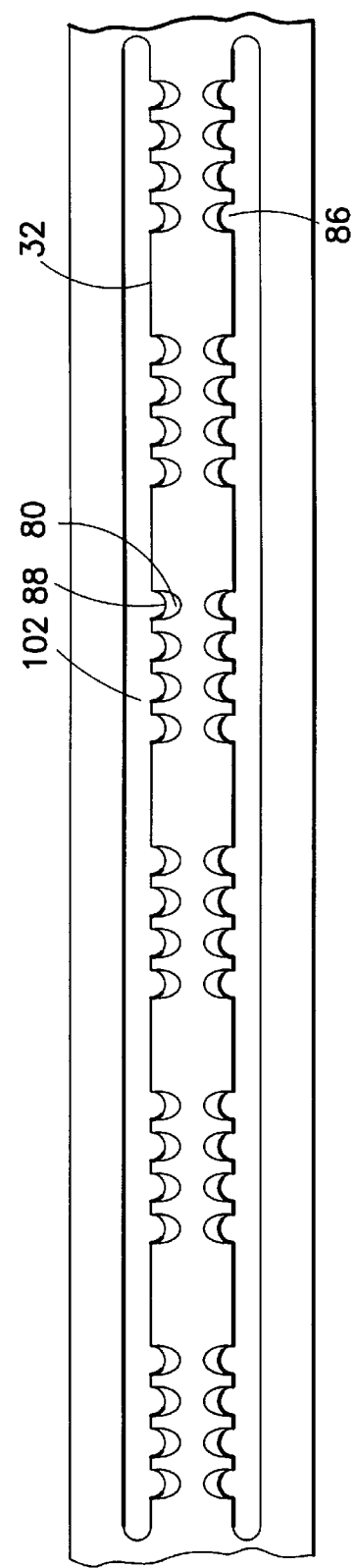
FIG. 6 is a partial top view of an interconnect member in accordance with a preferred embodiment of this invention during a further stage of its fabrication.
Figure 7:
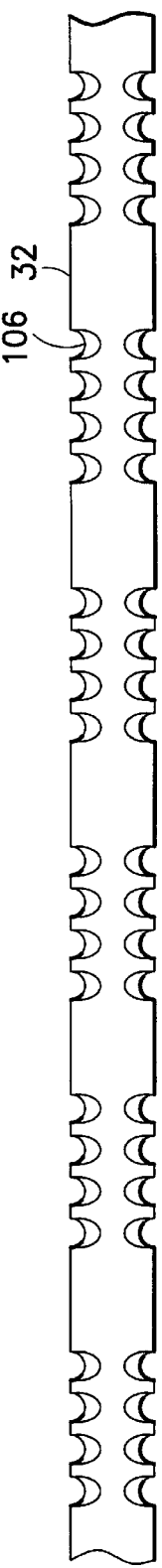
FIG. 7 is a partial top view of an interconnect member in accordance with a preferred embodiment of this invention during a further stage of its fabrication.
Figure 10:
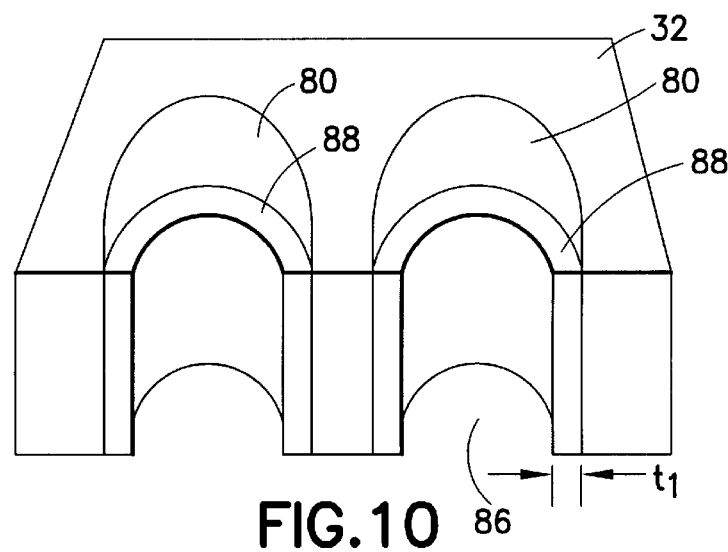
FIG. 10 is a partial perspective view of the interconnect member castellations after plating with a conductive material.

The board 32 is then drilled through the pads 80 on the top 48 all the way through the pads 80' on the bottom face 50 using an exemplary drill 100 size of about 0.032" on about a 0.050"×0.080" progression to create the openings 86 as shown in FIGS. 5 and 12. Without the necessity of adding a solder mask, the holes 86 are then plated by conventional electroplating, electroless plating, or any other desired technique. In this example electroplating the holes 86 creates a barrel platted connection 88 (see also FIG. 10) between the pads 80 on the top face 48 and the pads 80' on the bottom face 50 of the member 32. This plating 88 would be carried out in a conventional manner to obtain a nominal wall thickness $t_1$ of about 0.001 inch. This brings the size holes 86 to a nominal diameter of about 0.030" diameter. As shown in FIG. 6 the member 32 is then divided by routing slots 102 alongside the center of the drilled holes 86 to provide the interconnect members 32. Thereafter a de-smearing operation may be carried out to debur the exposed metalization 88. Next as in FIGS. 7 and 14 the member 32 would be processed through a Hot Air Solder Leveling (H.A.S.L.) operation to provide a surface solder plating 106 of about 0.001" build-up on the metalization 88 in the holes 86 and the pads 80, 80'. The solder plating 106 would produce the equivalent of about a 0.028" dia. finished hole 86 size.

Figure 8:
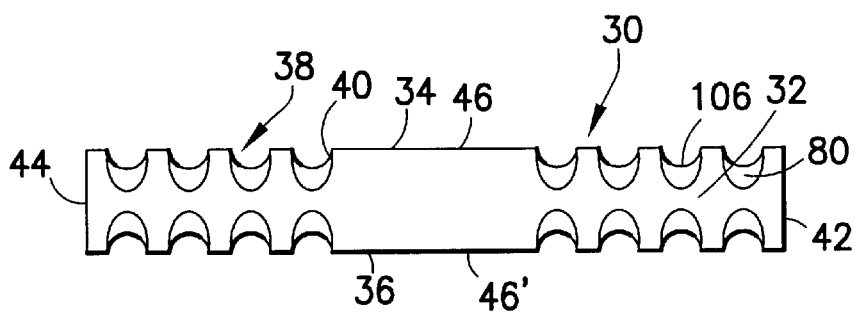
FIG. 8 is a top view of a singulated interconnect member in accordance with a preferred embodiment of this invention.
Figure 9:
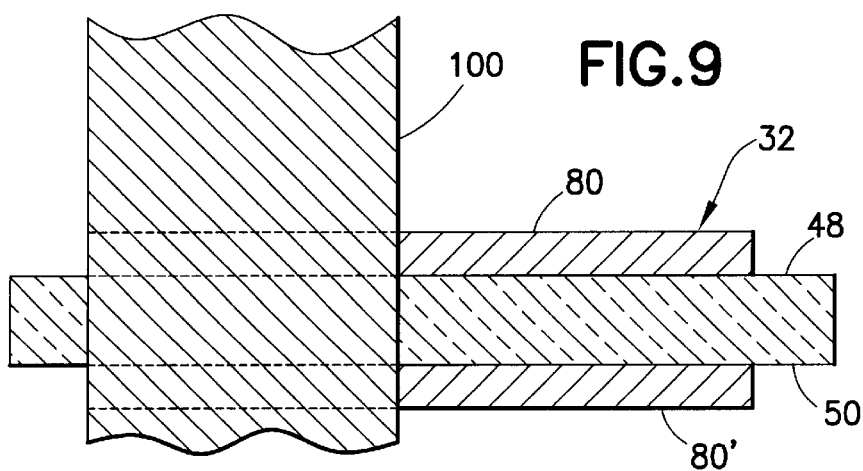
FIG. 9 is a partially cross sectional view illustrating an exemplary embodiment of the process for forming the openings in the interconnect member.

Finally, the individual interconnect members 32 would be singulated as in FIG. 8, from the panel or strip, by any desired conventional means such as, for example, shearing or sawing.

The process for using the interconnect 30 of this invention may be exemplified as follows:

Due to the small size of the interconnect 30 a portion 46 of the surface 48 of approximately 0.165 inch×0.080 inch has been incorporated into the interconnect 30 a to accommodate nozzle clearance for industry standard Surface Mount Pick and Place Equipment. The interconnect 30 of this invention is also conducive to Tape & Reel packaging as in FIG. 12 for high volume automated placement. Placement of the interconnect 30 on the bottom side 48 of the multi-chip module would be accomplished by panelizing and fixturing of the individual interconnects through industry standard SMT processes. The interconnects 30 would preferably be the last components placed on the bottom face 48 of the module 10. They would be soldered to the module using a high temperature reflow solder. Epoxy chip bonder can also be used to mate the interconnects 30 to the module 10 in combination with the solder.

Mating of the module 10 to the main board 22 would be accomplished by processing the main board through industry standard SMT operations using a lower temperature reflow solder. Reflow operations for soldering the module 10 to the main board would not require special processing, since the module 10 with the interconnects 30 would presumably be processed along with many other components mounted on the main board 22.

While the present invention has been described in connection with the preferred embodiments of the various figures, it is to be understood that other similar embodiments may be used or modifications and additions may be made to the described embodiment for performing the same function of the present invention without deviating therefrom. Further, the arrangements described can be used with respect to components other than connectors, that comprise housings formed of insulative materials which carry elements to be fused onto a PWB or other electrical substrate. Therefore, the present invention should not be limited to any single embodiment, but rather construed in breadth and scope in accordance with the recitation of the appended claims.

What is claimed is:

1. An interconnect for attaching a module to a circuit substrate comprising:

a member elongated in a longitudinal direction, said member having at least a first elongated side and a second opposed and generally parallel elongated side, said first and second sides extending in said longitudinal direction, said member further comprising a third side and a fourth side extending between said first and second sides;

each of said first and second sides having at least one portion having a series of depressions in said respective first and second sides extending inwardly from a first outer surface of said first side and a second outer surface of said second side;

circuit pads attached to said third and fourth sides of the member adjacent said depressions; and metallized conductors formed separately from the circuit pads in the depressions and connected to outer edges of the circuit pads to form leads between respective pairs of said circuit pads on said third and fourth sides.

2. The interconnect as in claim 1 wherein said module is a multi-chip module and said depressions have a generally semi-cylindrical shape.

3. The interconnect as in claim 1 wherein said module is a multi-chip module and wherein each of said first and second sides extends from a first traverse end of said member to a second transverse end of said member; and wherein each of said sides includes at least one portion, intermediate said ends which is free of depressions.

4. The interconnect as in claim 3 wherein said third and forth sides extend respectively between said first and second sides and wherein the portion of each of the third and fourth sides associated with the depression free portions of the first and second sides is adapted for receiving a pick and place assembly device.

5. An interconnect as in claim 1 wherein said circuit pads each comprise a hole therethrough forming a recess aligned with said depressions.

6. An interconnect as in claim 1 wherein said metallized conductors comprise a general concave shape.

7. An interconnect as in claim 1 wherein the member comprises a rigid printed circuit board.

8. An interconnect as in claim 1 wherein the member comprises a flexible printed circuit board.

9. A multi-chip module circuit assembly comprising:

a multi-chip module having a plurality of electronic elements;

a circuit substrate supporting thereon a conductive circuit pattern adapted for connection to said multi-chip module;

at least one interconnect for attaching said multi-chip module to said circuit pattern on said circuit substrate, said interconnect comprising:
- a member elongated in a longitudinal direction, said member having at least a first elongated side and a second opposed and generally parallel elongated side, said first and second sides extending in said longitudinal direction, said member further comprising a third side and a fourth side extending between said first and second sides;
- each of said first and second sides having at least one portion formed by a series of depressions in
- said respective first and second sides extending inwardly from a first outer surface of said first side and a second outer surface of said second side;
- circuit pads connected to said third and fourth sides adjacent said depressions; and
- metallized conductors formed separately from the circuit pads in the depressions and connected to outer edges of the circuit pads to form leads between said circuit pads on said third and fourth sides which connect at least one electronic element of said multi-chip module to said conductive circuit pattern of said circuit substrate.

10. The circuit assembly as in claim 9 wherein said depressions have a generally semi-cylindrical shape.

11. The circuit assembly as in claim 9 wherein each of said first and second sides extends from a first transverse end of said member to a second transverse end of said member; and wherein each of said sides includes at least one portion, intermediate said ends which is free of depressions.

12. The circuit assembly as in claim 11 wherein said third and forth sides extend respectively between said first and second sides and wherein the portion of each of the third and fourth sides associated with the depression free portions of the first and second sides is adapted for receiving a pick and place assembly device.

13. The circuit assembly as in claim 9 wherein a plurality of said interconnect members are connected between said multi-chip module and said circuit substrate.

14. The circuit assembly as in claim 13 wherein said multi-chip module includes a first major face and a second opposed major face and wherein first electronic elements are supported by said first face and additional second electronic elements are supported by said second face and wherein said interconnect members space said multi-chip module from said circuit substrate by an amount greater than the thickness of electronic elements arranged on said multi-chip module between said multi-chip module and said circuit substrate.

15. The circuit assembly as in claim 14 wherein at least two of said interconnect members connect said multi-chip module to said circuit substrate and wherein each of said interconnect members is arranged toward a different edge of said multi-chip module.

16. A multi-chip module circuit assembly as in claim 9 wherein the member comprises a rigid printed circuit board.

17. A multi-chip module circuit assembly as in claim 9 wherein the member comprises a flexible printed circuit board.

18. A multi-chip module circuit assembly as in claim 5 wherein said circuit pads each comprise a hole therethrough forming a recess aligned with said depressions.

19. An interconnect as in claim 6 further comprising a surface solder plating located in the metallized conductors, wherein the solder plating comprises a general concave shape.

20. A multi-chip module circuit assembly as in claim 9 wherein said metallized conductors comprise a general concave shape.

21. A multi-chip module circuit assembly as in claim 20 further comprising a surface solder plating located in the metallized conductors, wherein the solder plating comprises a general concave shape.

* * * * *